(12) United States Patent
Mun et al.

(10) Patent No.: US 11,948,645 B2
(45) Date of Patent: Apr. 2, 2024

(54) PAGE BUFFER, MEMORY DEVICE INCLUDING THE PAGE BUFFER AND OPERATING METHOD THEREOF

(71) Applicant: SK hynix Inc., Gyeonggi-do (KR)

(72) Inventors: Yeong Jo Mun, Gyeonggi-do (KR); Dong Hun Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 162 days.

(21) Appl. No.: 17/575,115

(22) Filed: Jan. 13, 2022

(65) Prior Publication Data

US 2023/0039585 A1 Feb. 9, 2023

(30) Foreign Application Priority Data

Aug. 9, 2021 (KR) .................. 10-2021-0104892

(51) Int. Cl.
*G11C 16/26* (2006.01)
*G11C 16/24* (2006.01)
*G11C 16/04* (2006.01)

(52) U.S. Cl.
CPC .............. *G11C 16/26* (2013.01); *G11C 16/24* (2013.01); *G11C 16/0483* (2013.01)

(58) Field of Classification Search
CPC ..... G11C 16/0483; G11C 16/26; G11C 16/24; G11C 11/5642; G11C 16/3459; G11C 16/10; G11C 16/32; G11C 2211/5642; G11C 16/30; G11C 7/12; G11C 16/08; G11C 7/02; G11C 7/08; G11C 7/1009; G11C 7/106; G11C 7/1087; G11C 16/3404; G11C 7/065; G11C 7/1057; G11C 11/5671; G11C 16/3418; G11C 2211/563; G11C 2211/5647; G11C 7/1084; G11C 8/08

See application file for complete search history.

(56) References Cited

U.S. PATENT DOCUMENTS 11,538,531 B2 * 12/2022 Choi .................. G11C 16/0483

FOREIGN PATENT DOCUMENTS

| KR | 10-2010-0022228 A | 3/2010 |
|---|---|---|
| KR | 10-2019-0050487 A | 5/2019 |
| KR | 10-2058664 B1 | 12/2019 |

* cited by examiner

*Primary Examiner* — Thong Q Le
(74) *Attorney, Agent, or Firm* — IP & T GROUP LLP

(57) ABSTRACT

An electronic device, and more particularly, a page buffer is provided. The page buffer includes a sensing node configured to sense a potential of a bit line coupled to a memory cell, a precharging circuit coupled to the sensing node and configured to precharge a potential of the sensing node to a first voltage during an evaluation operation on the memory cell, a discharging circuit coupled to the sensing node and configured to discharge the potential of the sensing node from the first voltage to a second voltage, and a latch circuit coupled to the discharging circuit and configured to store therein data sensed from the memory cell based on a result of comparing the potential of the sensing node with a reference voltage after the potential of the sensing node is discharged to the second voltage and a predetermined period elapses.

15 Claims, 10 Drawing Sheets

PAGE BUFFER, MEMORY DEVICE INCLUDING THE PAGE BUFFER AND OPERATING METHOD THEREOF

CROSS-REFERENCE TO RELATED APPLICATION

The present application claims priority under 35 U.S.C. § 119(a) to Korean patent application number 10-2021-0104892, filed on Aug. 9, 2021, and which is incorporated herein by reference in its entirety.

BACKGROUND

Field of Invention

Various embodiments of the present disclosure generally relate to an electronic device, and more particularly, to a page buffer, a memory device including the page buffer and an operating method of the memory device.

Description of Related Art

A storage device may store data in response to control of a host device such as a computer or a smartphone. The storage device may include a memory device storing data and a memory controller controlling the memory device. Generally, there are two types of memory devices: volatile memory devices and nonvolatile memory devices.

The volatile memory devices may store data only when power is supplied thereto, and may lose data stored therein when power is not supplied. Examples of the volatile memory devices include a Static Random Access Memory (SRAM) device, a Dynamic Random Access Memory (DRAM) device, and the like.

The nonvolatile memory devices may retain stored data even when supply of power is interrupted or blocked. Examples of the nonvolatile memory devices include a Read Only Memory (ROM) device, a Programmable ROM (PROM) device, an Electrically Programmable ROM (EPROM) device, an Electrically Erasable and Programmable ROM (EEPROM) device, a flash memory device, and the like.

SUMMARY

Various embodiments of the present disclosure are directed to a page buffer in which overshoot of a bit line voltage is mitigated and an evaluation time is reduced during a read operation or a verify operation, and a memory device including the page buffer.

According to an embodiment of the present disclosure, a page buffer may include a sensing node configured to sense a potential of a bit line coupled to a memory cell, a precharging circuit coupled to the sensing node and configured to precharge a potential of the sensing node to a first voltage during an evaluation operation on the memory cell, a discharging circuit coupled to the sensing node and configured to discharge the potential of the sensing node from the first voltage to a second voltage, and a latch circuit coupled to the discharging circuit and configured to store therein data sensed from the memory cell based on a result of comparing the potential of the sensing node with a reference voltage after the potential of the sensing node is discharged to the second voltage and a predetermined period elapses, wherein the evaluation operation is an operation of sensing a threshold voltage of the memory cell through the comparing the potential of the sensing node with the reference voltage and sensing a threshold voltage.

According to an embodiment of the present disclosure, a memory device may include a plurality of memory cells, a peripheral circuit including a plurality of page buffers coupled to the plurality of memory cells through bit lines and configured to perform a read operation on selected memory cells among the plurality of memory cells, and a control logic configured to control the peripheral circuit to sense data stored in the selected memory cells during the read operation, wherein each of the plurality of page buffers comprises a first switch coupled between a bit line coupled to a memory cell and a first sensing node, a second switch coupled between the first sensing node and a second sensing node, a precharging circuit coupled to the first sensing node and the second sensing node and configured to precharge the bit line to a precharge voltage during a bit line precharge operation of the read operation and configured to precharge the second sensing node to a first voltage during an evaluation operation of the read operation, a discharging circuit coupled to the second sensing node and configured to discharge a potential of the second sensing node from the first voltage to a second voltage during the evaluation operation, and a latch circuit coupled to the discharging circuit and the second sensing node and configured to store therein the data of the selected memory cells based on a result of comparing the potential of the second sensing node with a reference voltage after the potential of the second sensing node is discharged to the second voltage and a predetermined period elapses.

According to an embodiment of the present disclosure, a method of operating a memory device may include precharging a bit line coupled to a memory cell to a precharge voltage, precharging a potential of a sensing node coupled to the bit line to a first voltage, discharging the potential of the sensing node from the first voltage to a second voltage, and storing data of the memory cell in a latch circuit based on a result of comparing the potential of the sensing node with a reference voltage after the potential of the sensing node is discharged to the second voltage and a predetermined period elapses, wherein the first voltage is a default voltage for precharging the sensing node to sense a threshold voltage of the memory cell.

DETAILED DESCRIPTION

Specific structural and functional features of the present disclosure are disclosed in the context of the following embodiments of this disclosure. However, the present disclosure may be configured, arranged, or carried out differently than disclosed herein. Thus, the present disclosure is not limited to any particular embodiment nor to any specific details. Also, throughout the specification, reference to "an embodiment," "another embodiment" or the like is not necessarily to only one embodiment, and different references to any such phrase are not necessarily to the same embodiment. Moreover, the use of an indefinite article (i.e., "a" or "an") means one or more, unless it is clear that only one is intended. Similarly, terms "comprising," "including," "having" and the like, when used herein, do not preclude the existence or addition of one or more other elements in addition to the stated element(s).

It should be understood that the drawings are simplified schematic illustrations of the described devices and may not include well-known details in order to avoid obscuring the features of the invention.

It should also be noted that features present in one embodiment may be used with one or more features of another embodiment without departing from the scope of the invention.

It is further noted, that in the various drawings, like reference numbers designate like elements.

Hereinafter, various embodiments of the present disclosure are described in detail with reference to the accompanying drawings.

Figure 1:
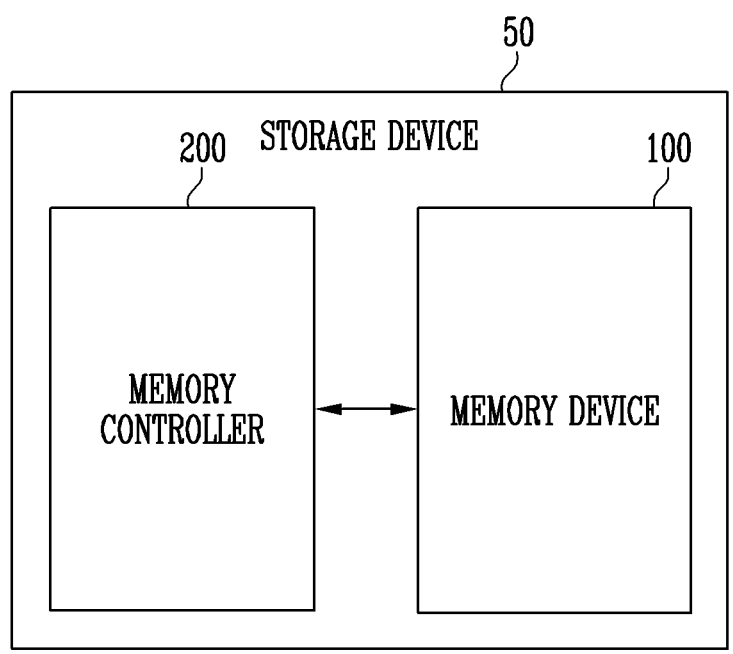
FIG. 1 is a diagram illustrating a storage device according to an embodiment of the present disclosure.

FIG. 1 is a diagram illustrating a storage device 50 according to an embodiment of the present disclosure.

Referring to FIG. 1, the storage device 50 may include a memory device 100 and a memory controller 200 controlling operations of the memory device 100. The storage device 50 may store data in response to control of a host. Examples of the host may include a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface corresponding to a communication method with the host. The storage device 50 may be configured as one of various types of storage devices such as a solid state drive (SSD), a multimedia card in the form of a multimedia card (MMC), an embedded MMC (eMMC), a Reduced-Size MMC (RS-MMC), and a micro-MMC, a secure digital card in the form of a secure digital (SD) card, a mini-SD card, and a micro-SD card, a Universal Serial Bus (USB) storage device, a Universal Flash Storage (UFS) device, a Personal Computer Memory Card International Association (PCM-CIA) card type storage device, a peripheral component interconnect (PCI) card type storage device, a PCI Express (PCI-e) card type storage device, a compact flash (CF) card, a smart media card, and a memory stick.

The storage device 50 may be manufactured as one of various types of packages. The storage device 50 may be manufactured as one of various package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 may operate in response to control of the memory controller 200. The memory device 100 may include a memory cell array including a plurality of memory cells storing data. The memory cell array may include a plurality of memory blocks. Each of the memory blocks may include a plurality of memory cells. Each memory block may include a plurality of pages. According to an embodiment, a page may be a unit for storing data in the memory device 100 or reading data stored in the memory device 100. The memory block may be a unit for erasing data. According to an embodiment, the memory device 100 may be Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), NAND flash memory, Vertical NAND flash memory, NOR flash memory, Resistive Random Access Memory (RRAM), Phase-Change Random Access Memory (PRAM), Magnetoresistive Random Access Memory (MRAM), Ferroelectric Random Access Memory (FRAM), or Spin-Transfer Torque Random Access Memory (STT-RAM). By way of example, the memory device 100 is NAND flash memory in the context of the following description.

The memory device 100 may receive a command and an address from the memory controller 200, and access an area selected by the address in the memory cell array of the memory device 100. That is, the memory device 100 may perform an operation corresponding to the command on the area selected in response to the address. For example, the memory device 100 may perform a write operation (or a program operation), a read operation, and an erase operation. During the program operation, the memory device 100 may program data into the area selected by the address. During the read operation, the memory device 100 may read data from the area selected by the address. During the erase operation, the memory device 100 may erase data from the area selected by the address.

The memory controller 200 may control general operations of the storage device 50.

When power is supplied to the storage device 50, the memory controller 200 may execute instructions such as firmware (FW). When the memory device 100 is a flash memory device, the memory controller 200 may execute firmware such as a Flash Translation Layer (FTL) for controlling communication between the host and the memory device 100.

According to an embodiment, the memory controller 200 may receive data and a Logical Block Address (LBA) from the host and convert the LBA into a Physical Block Address (PBA) indicating addresses of memory cells in the memory device 100 in which data is to be stored.

The memory controller 200 may control the memory device 100 to perform a program operation, a read operation or an erase operation in response to a request from the host. During the program operation, the memory controller 200 may provide a program command, a PBA and data to the memory device 100. During the read operation, the memory controller 200 may provide a read command and a PBA to the memory device 100. During the erase operation, the memory controller 200 may provide an erase command and a PBA to the memory device 100.

According to an embodiment, the memory controller 200 may autonomously generate a program command, an address, and data without receiving a request from the host, and transmit them to the memory device 100. For example, the memory controller 200 may provide a command, an address, and data to the memory device 100 to perform background operations such as a program operation for wear leveling and a program operation for garbage collection.

According to an embodiment, the memory controller 200 may control at least two memory devices 100. The memory controller 200 may control the memory devices 100 according to an interleaving scheme to improve operational performance.

The host may communicate with the storage device 50 using at least one of various communication standards or interfaces, such as Universal Serial Bus (USB), Serial AT Attachment (SATA), Serial Attached SCSI (SAS), High Speed Interchip (HSIC), Small Computer System Interface (SCSI), Peripheral Component Interconnect (PCI), PCI Express (PCI-e), NonVolatile Memory express (NVMe), Universal Flash Storage (UFS), Secure Digital (SD), a MultiMedia Card (MMC), an embedded MMC (eMMC), a Dual In-line Memory Module (DIMM), a Registered DIMM (RDIMM), and a Load Reduced DIMM (LRDIMM).

Figure 2:
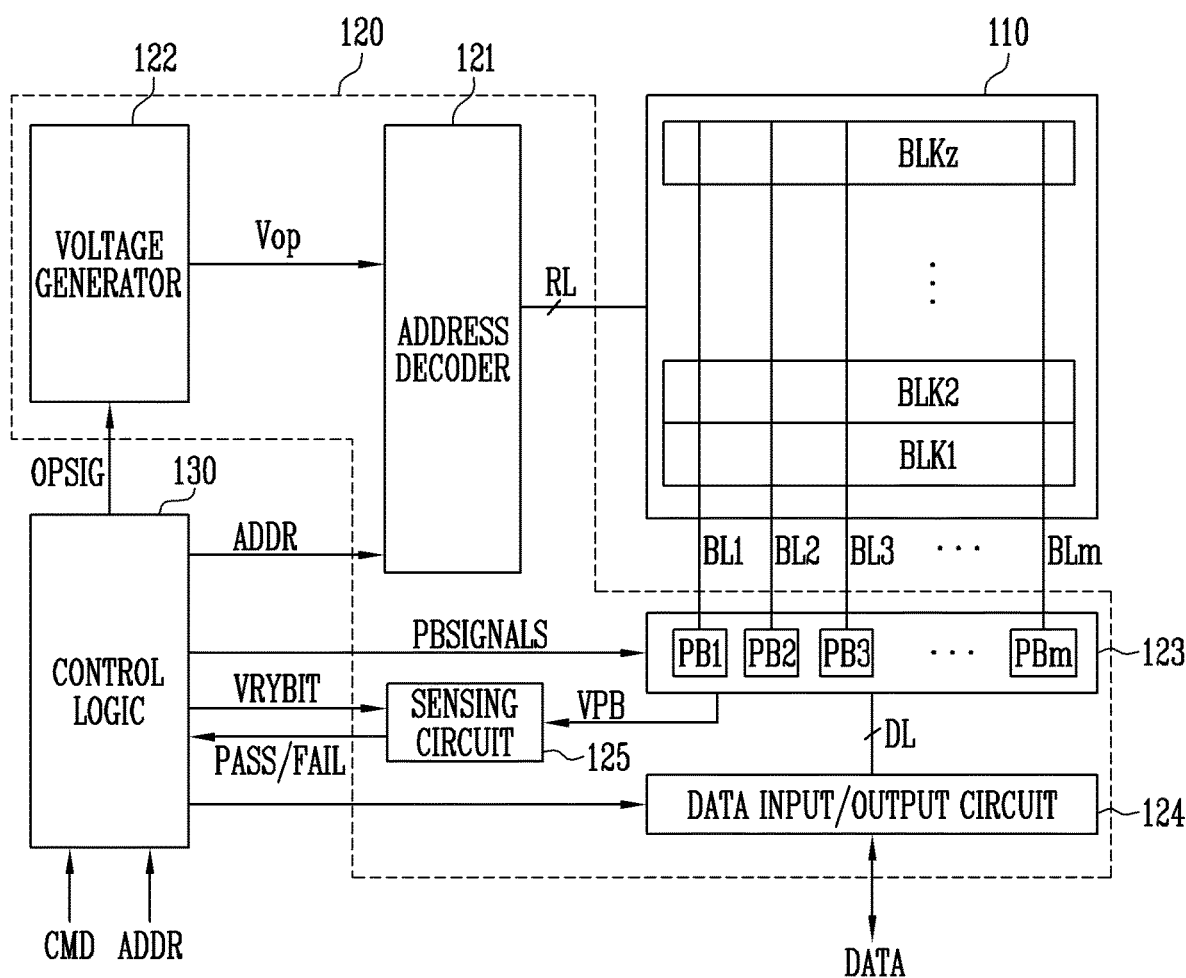
FIG. 2 is a diagram illustrating a structure of a memory device shown in FIG. 1 according to an embodiment of the present disclosure.

FIG. 2 is a diagram illustrating a structure of the memory device 100 shown in FIG. 1 according to an embodiment of the present disclosure.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The plurality of memory blocks BLK1 to BLKz may be coupled to a read and write circuit 123 through bit lines BL1 to BLm. Each of the plurality of memory blocks BLK1 to BLKz may include a plurality of memory cells. According to an embodiment, the plurality of memory cells may be nonvolatile memory cells. Among the plurality of memory cells, memory cells coupled to the same word line may be defined as one physical page. That is, the memory cell array 110 may include a plurality of pages.

Each of the memory cells of the memory device 100 may include a Single-Level Cell (SLC) storing one bit of data, a Multi-Level Cell (MLC) storing two bits of data, a Triple-Level Cell (TLC) storing three bits of data, and a Quad-Level Cell (QLC) storing four bits of data.

The peripheral circuit 120 may include the address decoder 121, a voltage generator 122, the read and write circuit 123, and a data input/output circuit 124.

The peripheral circuit 120 may drive the memory cell array 110. For example, the peripheral circuit 120 may drive the memory cell array 110 to perform a program operation, a read operation, and an erase operation.

The address decoder 121 may be coupled to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 may be configured to operate in response to control of the control logic 130. The address decoder 121 may receive an address ADDR from the control logic 130.

The address decoder 121 may be configured to decode a block address of the received address ADDR. The address decoder 121 may select at least one memory block among the memory blocks BLK1 to BLKz according to the decoded block address. The address decoder 121 may be configured to decode a row address among the received address ADDR. The address decoder 121 may select at least one word line of the selected memory block by applying voltages provided from the voltage generator 122 to at least one word line according to the decoded row address.

During a program operation, the address decoder 121 may apply a program voltage to the selected word line and a pass voltage having a lower level than the program voltage to unselected word lines. During a program verify operation, the address decoder 121 may apply a verify voltage to the selected word line and a verify pass voltage having a higher level than the verify voltage to the unselected word lines.

During a read operation, the address decoder 121 may apply a read voltage to the selected word line and a pass voltage having a higher level than the read voltage to unselected word lines.

According to an embodiment of the present disclosure, an erase operation of the memory device 100 may be performed in units of memory blocks. The address ADDR input to the memory device 100 during the erase operation may include a block address. The address decoder 121 may decode the block address and select one memory block in response to the decoded block address. During the erase operation, the address decoder 121 may apply a ground voltage to word lines coupled to the selected memory block.

According to an embodiment of the present disclosure, the address decoder 121 may be configured to decode a column address of the received address ADDR. The decoded column address may be transferred to the read and write circuit 123. For example, the address decoder 121 may include components such as a row decoder, a column decoder and an address buffer.

The voltage generator 122 may be configured to generate a plurality of voltages by using an external power voltage supplied to the memory device 100. The voltage generator 122 may operate in response to control of the control logic 130.

According to an embodiment, the voltage generator 122 may generate an internal power voltage by regulating an external power voltage. The internal power voltage generated by the voltage generator 122 may be used as an operating voltage of the memory device 100.

According to an embodiment, the voltage generator 122 may generate a plurality of voltages by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selected read voltages, and a plurality of unselected read voltages.

The voltage generator 122 may include a plurality of pumping capacitors receiving the internal power voltage to generate a plurality of voltages having various voltage levels, and may generate the plurality of voltages by selectively activating the plurality of pumping capacitors in response to control of the control logic 130.

The plurality of generated voltages may be supplied to the memory cell array 110 by the address decoder 121.

The read and write circuit 123 may include first to mth page buffers PB1 to PBm. The first to mth page buffers PB1 to PBm may be coupled to the memory cell array 110 through the first to mth bit lines BL1 to BLm in a one-to-one manner. The first to mth page buffers PB1 to PBm may operate in response to the control of the control logic 130.

The first to mth page buffers PB1 PBm may communicate data DATA with the data input/output circuit 124. During a program operation, the first to mth page buffers PB1 to PBm may receive the data DATA to be stored through the data input/output circuit 124 and data lines DL.

During the program operation, when a program pulse is applied to the selected word line, the first to mth page buffers PB1 to PBm may transfer the data DATA to be stored which is received through the data input/output circuit 124 to the selected memory cells through the bit lines BL1 to BLm. The memory cells of a selected page may be programmed according to the transferred data DATA. A memory cell coupled to a bit line to which a program permission voltage (for example, a ground voltage) is applied may have an increased threshold voltage. A threshold voltage of a memory cell coupled to a bit line to which a program inhibition voltage (for example, a power voltage) is applied may be maintained. During a program verify operation, the first to mth page buffers PB1 to PBm may read the data DATA stored in the selected memory cells through the bit lines BL1 to BLm.

During a read operation, the read and write circuit 123 may read the data DATA through the bit lines BL1 to BLm from the memory cells of the selected page and may store the read data DATA in the first to mth page buffers PB1 to PBm.

During an erase operation, the read and write circuit 123 may float the bit lines BL1 to BLm. According to an embodiment, the read and write circuit 123 may include a column select circuit.

The data input/output circuit 124 may be coupled to the first to mth page buffers PB1 to PBm through the data lines DL. The data input/output circuit 124 may operate in response to control of the control logic 130.

The data input/output circuit 124 may include a plurality of input/output buffers (not shown) receiving the input data DATA. During a program operation, the data input/output circuit 124 may receive the data DATA to be stored from an external controller (not shown). During a read operation, the data input/output circuit 124 may output the data DATA transferred from the first to mth page buffers PB1 to PBm in the read and write circuit 123 to the external controller.

During a read operation or a verify operation, a sensing circuit 125 may generate a reference current in response to an allowable bit VRYBIT signal generated by the control logic 130 and may output a pass or fail signal PASS/FAIL to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may be configured to control general operations of the memory device 100. The control logic 130 may operate in response to a command CMD transferred from an external device.

The control logic 130 may control the peripheral circuit 120 by generating various signals in response to the command CMD and the address ADDR. For example, the control logic 130 may generate an operation signal OPSIG, an address ADDR, read and write circuit control signals PBSIGNALS, and the allowable bit VRYBIT in response to the command CMD and the address ADDR. The control logic 130 may output the operation signal OPSIG to the voltage generator 122, the address ADDR to the address decoder 121, the read and write circuit control signals PBSIGNALS to the read and write circuit 123, and the allowable bit VRYBIT to the sensing circuit 125. In addition, the control logic 130 may determine whether the verify operation passes or fails in response to the pass or fail signal PASS/FAIL output from the sensing circuit 125.

Figure 3A:
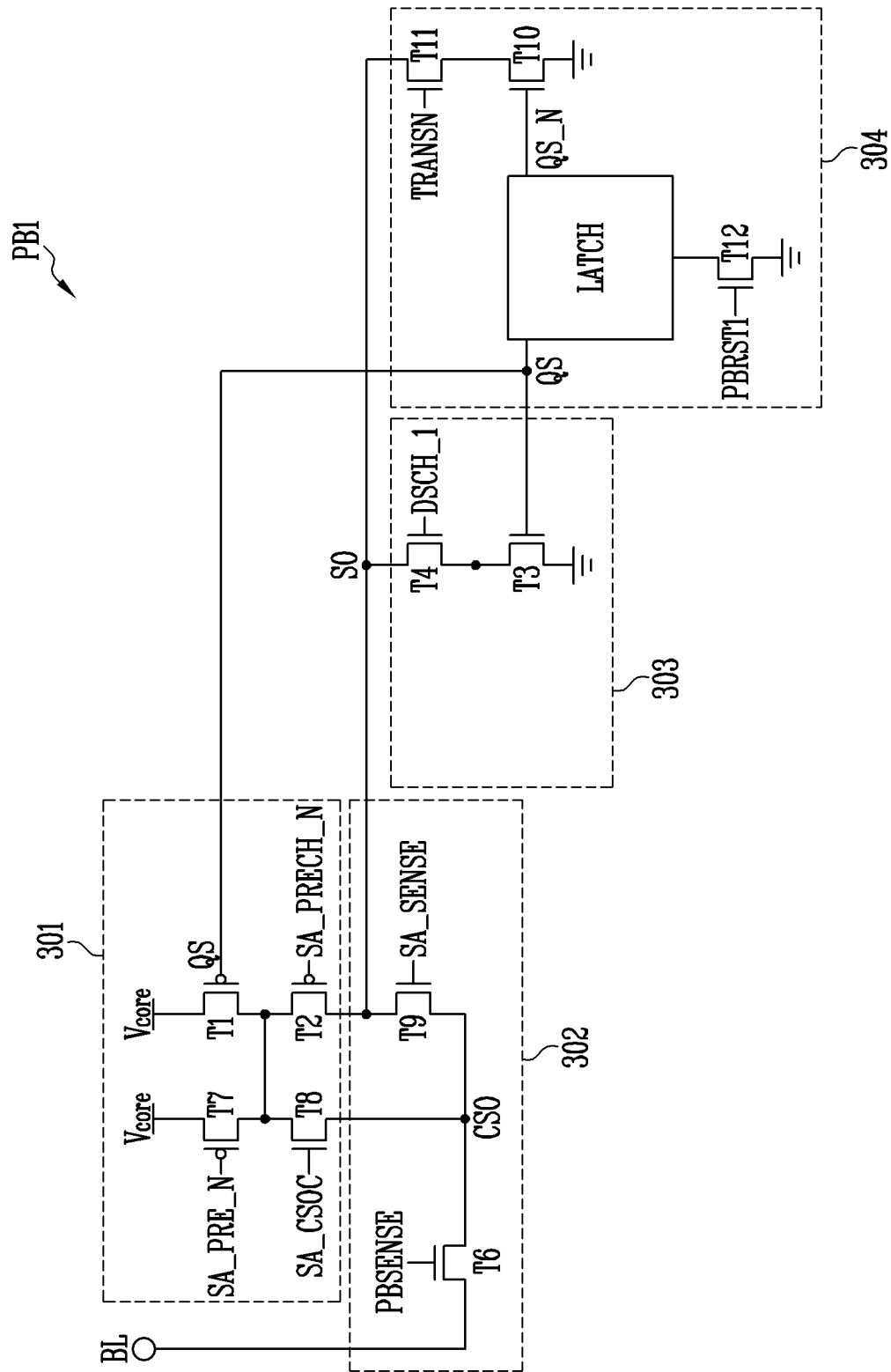
FIG. 3A is a diagram illustrating a configuration and an operation of a page buffer according to an embodiment of the present disclosure.

FIG. 3A is a diagram illustrating a configuration and an operation of a page buffer according to an embodiment of the present disclosure.

Referring to FIG. 3A, the page buffer PB1 may be coupled to the memory cell through the bit line BL. The page buffer PB1 may include first to fourth and sixth to twelfth transistors T1 to T4 and T6 to T12. The first, second, and seventh transistors T1, T2, and T7 may be P-MOS transistors. The third, fourth, and sixth transistors T3, T4, and T6 and the eighth to twelfth transistors T8 to T12 may be N-MOS transistors. Each transistor may be turned on or turned off in response to a signal applied to a gate thereof.

The page buffer PB1 may include a precharging circuit 301, a bit line coupling control circuit 302, a discharging circuit 303, and a latch circuit 304. The precharging circuit 301 may be coupled to the bit line coupling control circuit 302 through a first sensing node CSO and a second sensing node SO. The precharging circuit 301 may be coupled to the latch circuit 304 through a first node QS.

The bit line coupling control circuit 302 may be coupled to the bit line BL. The bit line coupling control circuit 302 may be coupled to the precharging circuit 301 through the first sensing node CSO and the second sensing node SO. The bit line coupling control circuit 302 may be coupled to the discharging circuit 303 through the second sensing node SO. The bit line coupling control circuit 302 may be coupled to the latch circuit 304 through the second sensing node SO.

The discharging circuit 303 may be coupled to the bit line coupling control circuit 302 through the second sensing node SO. The discharging circuit 303 may be coupled to the latch circuit 304 through the first node QS.

The latch circuit 304 may be coupled to the discharging circuit 303 through the first node QS. The latch circuit 304 may be coupled to the bit line coupling control circuit 302 through the second sensing node SO.

The precharging circuit 301 may include the first, second, seventh, and eighth transistors T1, T2, T7, and T8. More specifically, the seventh transistor T7 may be controlled by a pre-sensing signal SA_PRE_N. The eighth transistor T8 may be controlled by a first precharge signal SA_CSOC. The first transistor T1 may be controlled by a potential of the first node QS. The potential of the first node QS may indicate a data value stored in a latch. The second transistor T2 may be controlled by a second precharge signal SA_PRECH_N.

The precharging circuit 301 may perform an operation of precharging the first sensing node CSO in response to the first precharge signal SA_CSOC and the pre-sensing signal SA_PRE_N. When the sixth transistor T6 is turned on by a page buffer sensing signal PBSENSE, the bit line BL may be precharged. The precharging circuit 301 may perform an operation of precharging the second sensing node SO in response to the potential of the first node QS and the second precharge signal SA_PRECH_N.

The bit line coupling control circuit 302 may include the sixth and ninth transistors T6 and T9. More specifically, the sixth transistor T6 may be controlled by a page buffer sensing signal PBSENSE. The ninth transistor T9 may be controlled by a control signal SA_SENSE.

The bit line BL coupled to the memory cell may be precharged by turning on the sixth transistor T6 coupled to the first sensing node CSO in response to the page buffer sensing signal PBSENSE. The first sensing node CSO may be coupled to the second sensing node SO by turning on the ninth transistor T9 by the control signal SA_SENSE.

The discharging circuit 303 may include the third and fourth transistors T3 and T4. More specifically, the fourth transistor T4 may be controlled by a first discharge signal DSCH_1. The third transistor T3 may be controlled by the potential of the first node QS. The potential of the first node QS may indicate a data value stored in a latch.

The latch circuit 304 may include the tenth to twelfth transistors T10 to T12 and a latch component LATCH. More specifically, the eleventh transistor T11 may be controlled by a transfer signal TRANSN. The tenth transistor T10 may be controlled by a potential of the second node QS_N. The twelfth transistor T12 may be controlled by a page buffer reset signal PBRST1.

The latch component LATCH may sense and store a potential of the second sensing node SO, thereby storing a result of sensing a threshold voltage of a memory cell. More specifically, a potential of the bit line BL which is determined based on the threshold voltage of the memory cell during the sensing operation may be transferred to the first sensing node CSO in response to the page buffer sensing signal PBSENSE. The potential of the bit line BL which is transferred to the first sensing node CSO may be transferred to the second sensing node SO in response to the control signal SA_SENSE. The potential of the bit line BL which is the result of sensing the threshold voltage of the memory cell may be amplified in a process of transferring the potential of the bit line BL to the second sensing node SO. The latch circuit 304 may store a result of sensing the potential of the second sensing node SO in the latch component LATCH in response to the transfer signal TRANSN. According to various embodiments, the latch component LATCH may store the result of sensing a current of the second sensing node SO.

Figure 3B:
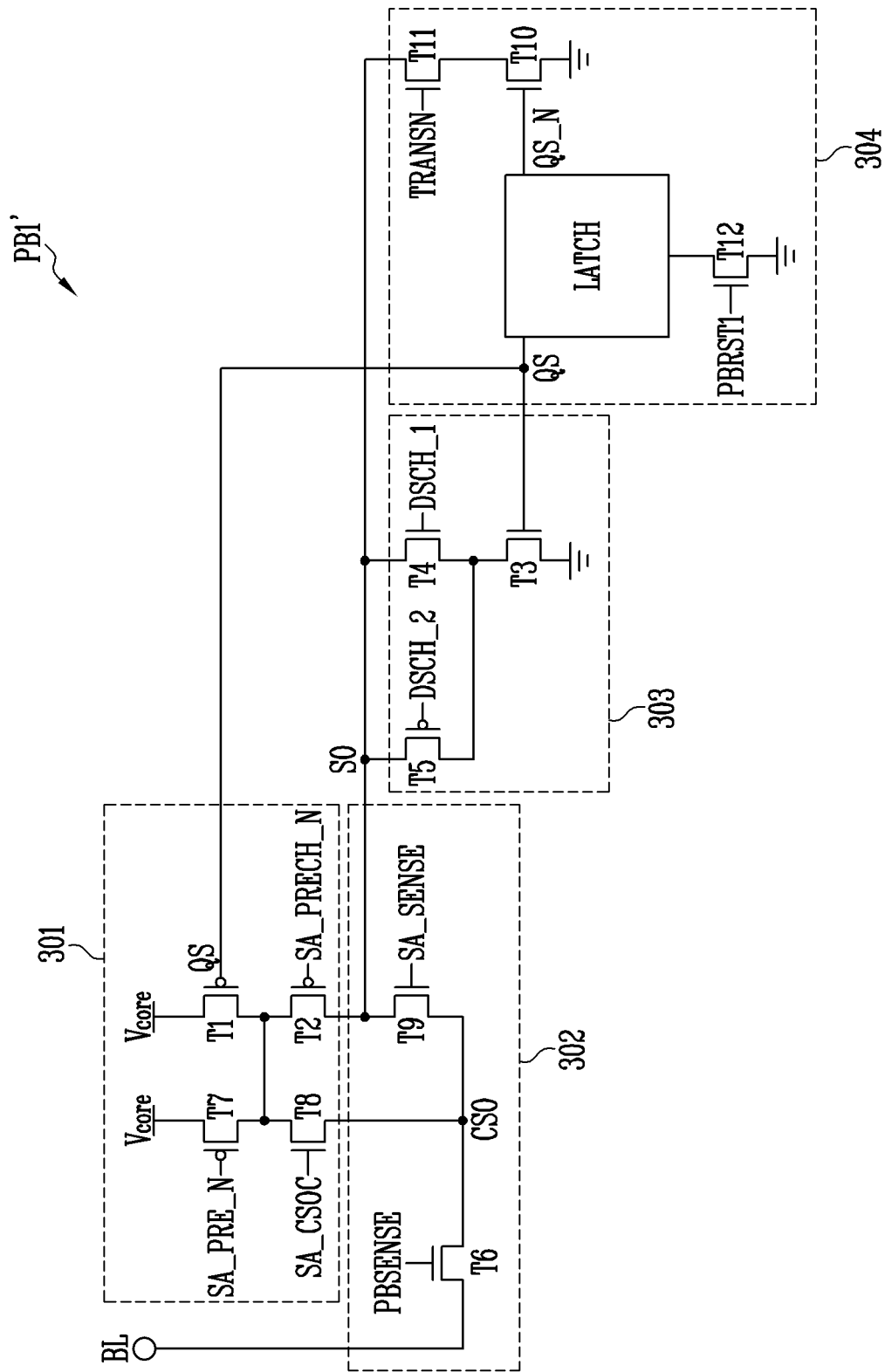
FIG. 3B is a diagram illustrating a configuration and an operation of a page buffer according to an embodiment of the present disclosure.

FIG. 3B is a diagram illustrating a configuration and an operation of a page buffer according to an embodiment of the present disclosure.

A page buffer PB1' according to an embodiment of the present disclosure may further include a fifth transistor T5 coupled to the second sensing node SO of the discharging circuit 303 compared to the page buffer PB1 described above with reference to FIG. 3A. The fifth transistor T5 may be a P-MOS device which is turned on when a negative voltage is applied thereto. More specifically, the fifth transistor T5 may be controlled in response to a second discharge signal DSCH_2.

According to an embodiment of the present disclosure, the page buffer PB1' may precisely control a voltage level of the second sensing node SO by applying a negative voltage to the second sensing node SO and a gate of the fifth transistor T5 and discharging the potential of the second sensing node SO.

Figure 4A:
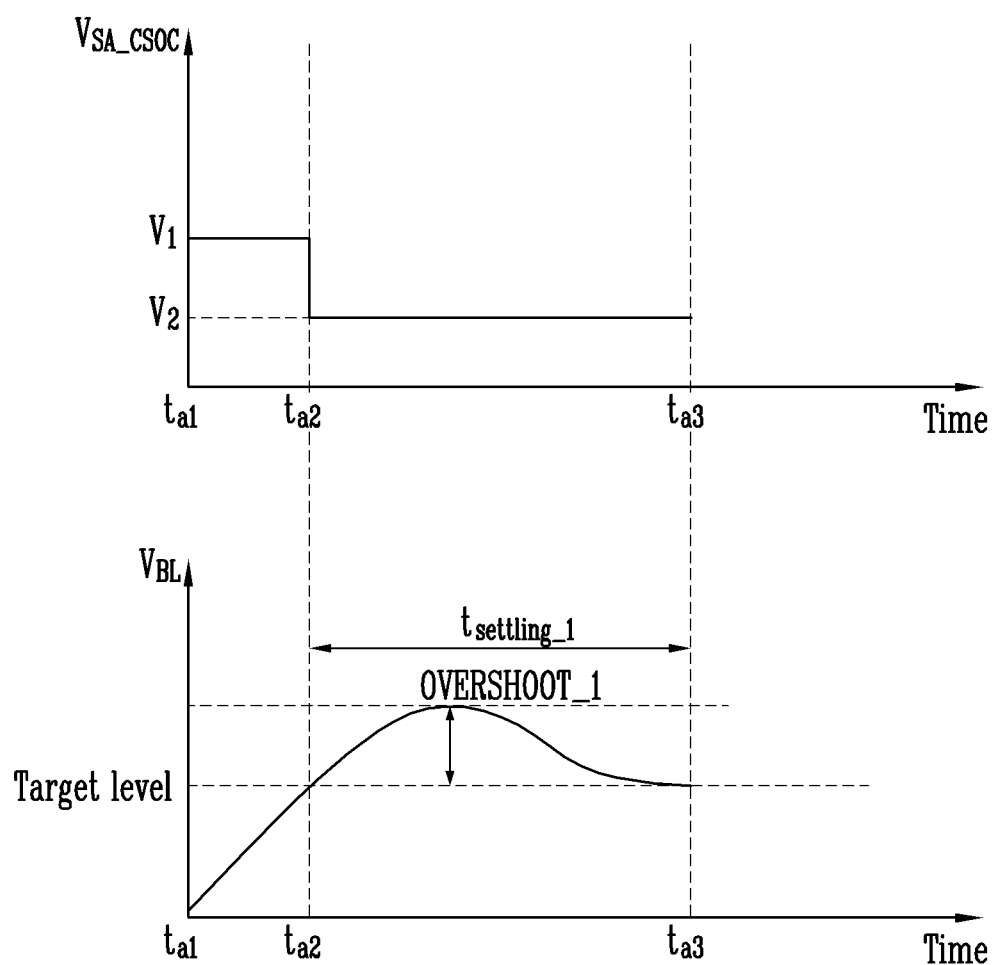
FIG. 4A is a diagram illustrating overshoot during precharge of a bit line according to an embodiment of the present disclosure.

FIG. 4A is a diagram illustrating overshoot when a bit line is precharged according to an embodiment of the present disclosure.

Referring to FIG. 3B, the bit line BL may be precharged to a predetermined voltage level by the precharging circuit 301 during an operation of a memory device.

More specifically, a voltage may be applied to the bit line BL during a program operation for storing data in the memory device or a read operation for reading the data stored in the memory device.

During the program operation for storing the data in the memory device, a program permission voltage may be applied to the bit line BL coupled to a selected memory cell. A program inhibition voltage may be applied to the bit line BL coupled to an unselected memory cell.

During the read operation for reading the data stored in the memory device, to precharge the bit line BL coupled to a memory cell to be sensed, a precharge voltage may be applied to the bit line BL coupled to a memory cell to be sensed.

When the bit line BL is precharged, an operation of the page buffer PB1 is as below.

Referring to FIG. 3A, the bit line BL may be precharged by applying a power voltage $V_{CORE}$ to the bit line BL. More specifically, the sixth transistor T6, the eighth transistor T8, and the seventh transistor T7 may be turned on by the page buffer sensing signal PBSENSE, the first precharge signal SA_CSOC, and the pre-sensing signal SA_PRE_N, respectively. The bit line BL may be precharged to a target level by turning on the sixth transistor T6, the seventh transistor T7, and the eighth transistor T8.

Referring to FIG. 4A, the first precharge signal SA_CSOC applied to a gate of the eighth transistor T8 may be applied in two steps. More specifically, a first voltage $V_1$ may be applied in the period between $t_{a1}$ and $t_{a2}$, and a second voltage $V_2$ may be applied in the period between $t_{a2}$ and $t_{a1}$. When the first and second voltages $V_1$ and $V_2$ are applied, overshoot of a bit line, that is, a phenomenon in which a potential level of a bit line $V_{BL}$ becomes higher than a target level Target level may occur. When the overshoot of the bit line occurs, a set-up time $t_{settling\_1}$ may be required for the potential level of the bit line $V_{BL}$ to reach the target level Target level.

Figure 4B:
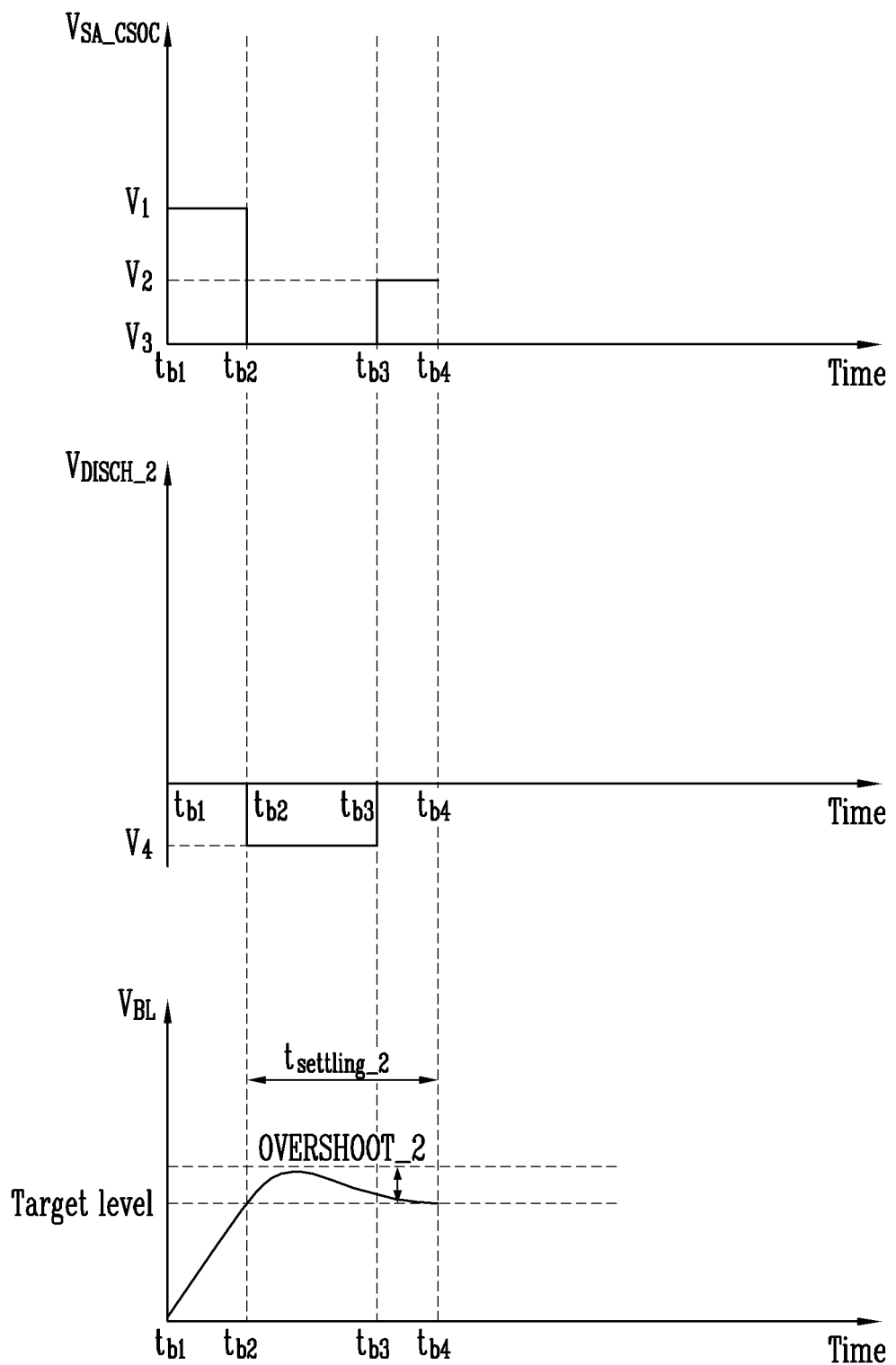
FIG. 4B is a diagram illustrating mitigation of overshoot according to an embodiment of the present disclosure.

FIG. 4B is a diagram illustrating mitigation of overshoot according to an embodiment of the present disclosure.

Referring to FIG. 4B, the first voltage $V_1$ may be applied as the first precharge signal SA_CSOC to the gate of the eighth transistor T8 in the period between $t_{b1}$ and $t_{b2}$. The first precharge signal SA_CSOC may be dropped to a third voltage $V_3$ in the period between $t_{b2}$ and $t_{b3}$, thereby turning off the eighth transistor T8. The third voltage $V_3$ may be a ground voltage. In the period between $t_{b2}$ and $t_{b3}$, the ninth transistor T9 and the third transistor T3 may be turned on by the control signal SA_SENSE and a voltage level of the first node QS, respectively. A fourth voltage $V_4$ may be applied as the second discharge signal DSCH_2 to the gate of the fifth transistor T5. The fourth voltage $V_4$ may be a negative voltage. When the fourth voltage $V_4$ is applied to the gate of the fifth transistor T5, the fifth transistor T5 may be turned on. Accordingly, a voltage precharged to the bit line BL may be discharged by the discharging circuit 303 in the period between $t_{b2}$ and $t_{b3}$, and therefore overshoot may be mitigated. When the voltage precharged to the bit line BL is discharged, a set-up time $t_{settling\_2}$ which is required for the potential of the bit line BL to reach the target level Target level may be less than the set-up time $t_{settling\_1}$ The second voltage $V_2$ may be applied as the first precharge signal SA_CSOC to the gate of the eighth transistor T8 in the period between $t_{b3}$ and $t_{b4}$. The second voltage $V_2$ may correspond to a voltage that could maintain a voltage level of the bit line BL to a target level. As it has been described in the embodiment of the present disclosure, a negative voltage having a predetermined level may be applied to the gate of the fifth transistor T5 coupled to the second sensing node SO, thereby mitigating overshoot and reducing a time required for a potential of the bit line BL to reach a target level.

Figure 5:
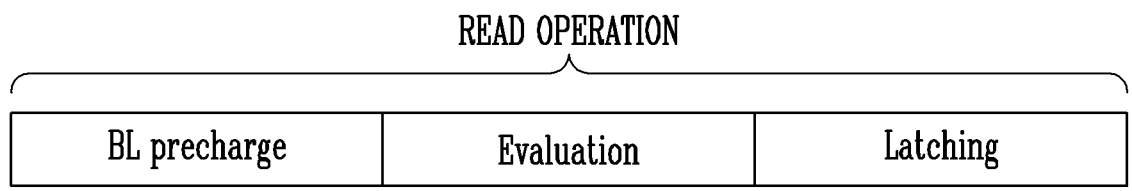
FIG. 5 is a diagram illustrating a read operation according to an embodiment of the present disclosure.

FIG. 5 is a diagram illustrating a read operation according to an embodiment of the present disclosure.

The read operation according to the embodiment of the present disclosure may include a bit line precharge period BL precharge, an evaluation period Evaluation, and a latching period Latching.

Referring to FIG. 3A, the bit line BL may be precharged to a precharge voltage in the bit line precharge period BL precharge. More specifically, the seventh and eighth transistors T7 and T8 coupled in series between a power voltage $V_{CORE}$ node and the first sensing node CSO may be turned on. The sixth transistor T6 coupled between the bit line BL and the first sensing node CSO may be turned on, thereby precharging the bit line BL to the precharge voltage. In addition, the first and second transistors T1 and T2 coupled in series between the power voltage $V_{CORE}$ node and the second sensing node SO may be turned on, thereby precharging the second sensing node SO.

An operation of changing or maintaining the voltage level of the second sensing node SO may be performed depending on the threshold voltage of the memory cell in the evaluation period Evaluation. When the memory cell is an on-cell and when a source select transistor coupled between the memory cell and a ground node is turned on, charges that are charged to the bit line BL may be discharged to the ground node through a source line. Accordingly, when a first duration time elapses, the potential of the bit line BL may decrease. When the memory cell is an off-cell, because the bit line BL and the source line are floated, the potential of the bit line BL may be maintained. The first duration time having a predetermined length elapses, the ninth transistor T9 coupled between the first sensing node CSO and the second sensing node SO may be turned on, thereby coupling the first sensing node CSO to the second sensing node SO. When the memory cell is the on-cell, the potential of the second sensing node SO may be discharged to the potential of the bit line BL. Accordingly, when a second duration time having a predetermined length elapses, the potential of the second sensing node SO may decrease to the potential of the bit line BL. When the memory cell is the off-cell, the potential of the second sensing node SO may be maintained.

After the evaluation period Evaluation is finished, a latch operation for sensing a voltage of the second sensing node SO and storing a sensing result in the latch component LATCH may be performed. Before storing the sensing result of the memory cell in the latch component LATCH, an operation of initializing a latch may be accompanied. The latch component LATCH may sense and store the potential of the second sensing node SO, thereby storing a result of sensing the threshold voltage of the memory cell. More specifically, the latch circuit 304 may store a result of sensing the potential of the second sensing node SO in the latch component LATCH in response to the transfer signal TRANSN. According to various embodiments, the latch component LATCH may store a result of sensing a current of the second sensing node SO.

Figure 6:
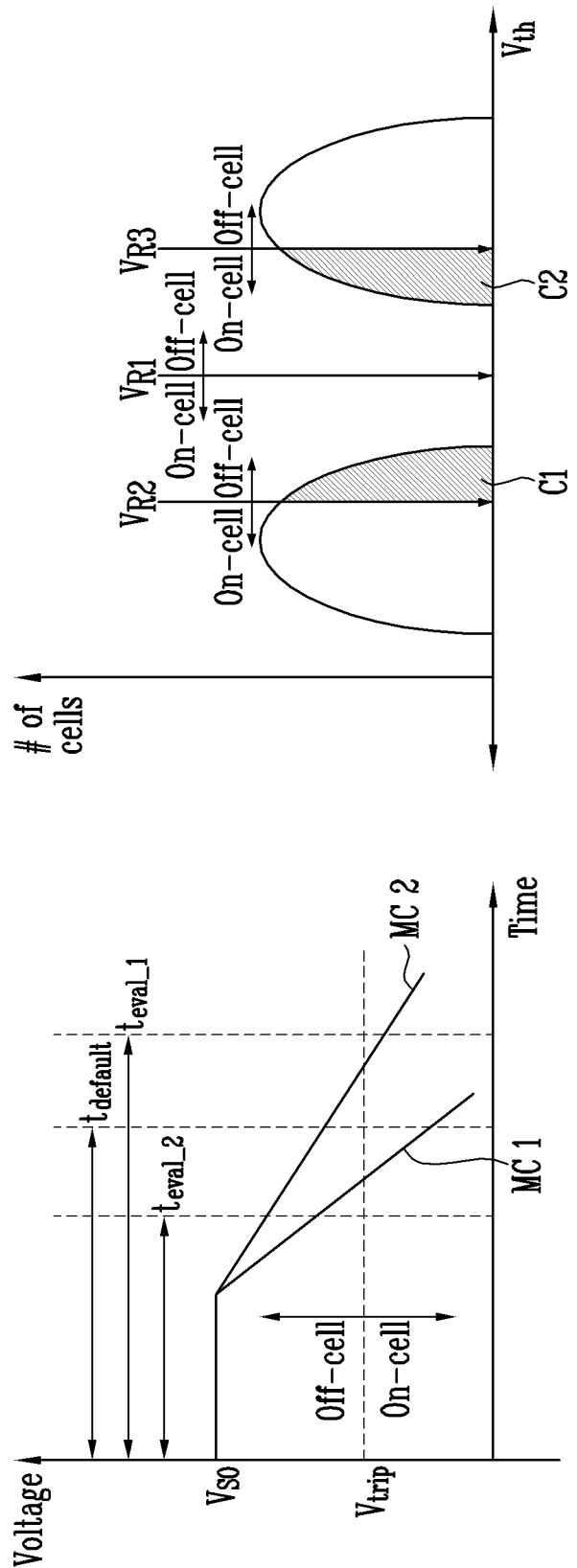
FIG. 6 is a diagram illustrating adjustment of an evaluation time during a read operation according to an embodiment of the present disclosure.

FIG. 6 is a diagram illustrating adjustment of an evaluation time during a read operation according to an embodiment of the present disclosure.

Referring to FIGS. 3A and 6, $V_{SO}$ indicates a voltage level at the second sensing node SO.

$V_{trip}$ indicates a level of a reference voltage which is used to determine the memory cell as the on-cell. When the threshold voltage of the memory cell is lower than the reference voltage $V_{trip}$, the memory cell may be determined as the on-cell.

Referring to FIG. 3B, the ninth transistor T9 may be turned on in the evaluation period Evaluation, thereby coupling the first sensing node CSO to the second sensing node SO. In case of a first memory cell MC1, when charges are discharged from the second sensing node SO, $V_{SO}$ may decrease. In case of a second memory cell MC2, when charges are discharged from the second sensing node SO by a leakage current, $V_{SO}$ may decrease. A discharge speed of the charges in the second memory cell MC2 may be lower than a discharge speed of the charges in the first memory cell MC1.

In case of the first memory cell MC1, when $V_{SO}$ is measured after a time period $t_{default}$ elapses, $V_{SO}$ is lower than $V_{trip}$ and thus the first memory cell MC1 may be sensed as the on-cell. In case of the second memory cell MC2, when $V_{SO}$ is measured immediately after the time period $t_{default}$ elapses, $V_{SO}$ is higher than $V_{trip}$ and thus the second memory cell MC2 may be sensed as the off-cell.

In case of the first memory cell MC1, when $V_{SO}$ is measured after the time period $t_{default}$ elapses, $V_{SO}$ is lower than $V_{trip}$ and thus the first memory cell MC1 may be read as the on-cell. In case of the first memory cell MC1, when $V_{SO}$ is measured after a time period $t_{eval\_2}$ elapses, $V_{SO}$ is higher than $V_{trip}$ and thus the first memory cell MC1 may be read as the off-cell. Accordingly, when an evaluation time is shorter than the time period $t_{default}$, $V_{SO}$ may be higher than $V_{trip}$ and the first memory cell MC1 may be erroneously read as the off-cell although the first memory cell MC1 is actually the on-cell.

In case of the second memory cell MC2, when $V_{SO}$ is measured after the time period $t_{default}$ elapses, $V_{SO}$ is higher than $V_{trip}$ and thus the second memory cell MC2 may be read as the off-cell. In case of the second memory cell MC2, when $V_{SO}$ is measured after a time period $t_{eval\_1}$ elapses, $V_{SO}$ is lower than $V_{trip}$ and thus the second memory cell MC2 may be read as the on-cell. That is, when an evaluation time increases to be longer than the time period $t_{default}$, $V_{SO}$ may decrease to have a smaller value than $V_{trip}$ and the second memory cell MC2 may be erroneously read as an on-cell although the second memory cell MC2 is actually an off-cell.

$V_{R1}$ indicates a read voltage applied to a word line of the memory cell to be sensed by the read operation. Referring to FIG. 6, when the evaluation time is the time period $t_{eval\_1}$, although an actual read voltage is $V_{R1}$, a sensing result by applying $V_{R1}$ as a read voltage may be the same as a sensing result by applying $V_{R2}$ as a read voltage. According to this example, although memory cells in region C1 are actually on-cells, the memory cells in region C1 may be erroneously sensed as off-cells. When the evaluation time is the time period $t_{eval\_2}$, although an actual read voltage is $V_{R1}$, a sensing result by applying $V_{R1}$ as a read voltage may be the same as a sensing result by applying $V_{R3}$ as a read voltage. According to this example, although memory cells in region C2 are actually off-cells, the memory cells in region C2 may be erroneously sensed as on-cells.

As it has been described above with reference to FIG. 6, it may be required to set an appropriate evaluation time to correctly determine whether a memory cell to be sensed is an on-cell or an off-cell.

Figure 7:
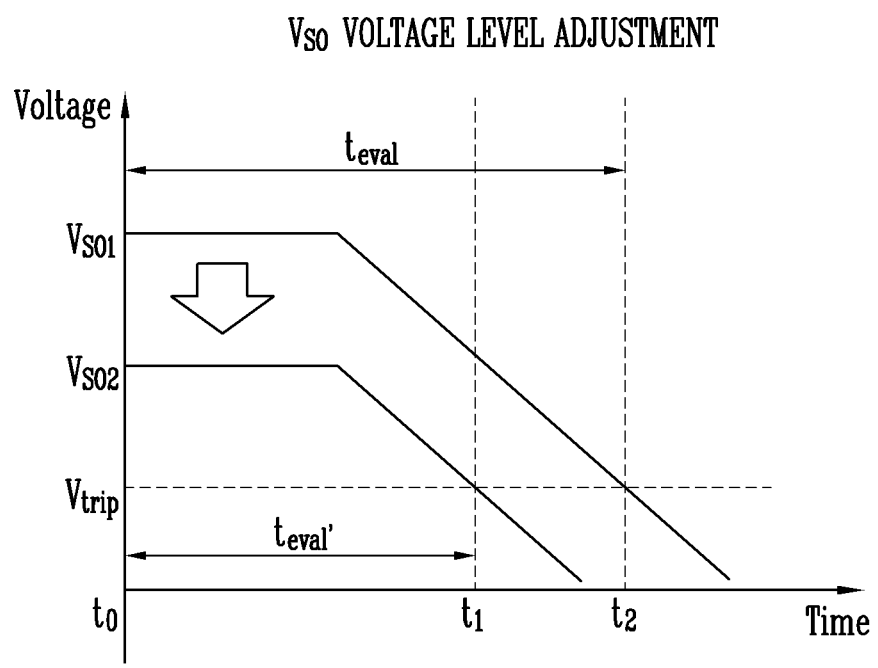
FIG. 7 is a diagram illustrating an effect of discharge according to a transistor coupled to a second sensing node during a read operation according to an embodiment of the present disclosure.

FIG. 7 is a diagram illustrating an effect of discharge according to a transistor coupled to the second sensing node SO during the read operation according to an embodiment of the present disclosure.

$V_{SO1}$ indicates a voltage level of the second sensing node SO when the second sensing node SO is not discharged. $V_{SO1}$ may be a voltage level, to which the second sensing node SO is precharged, without the discharge, to sense a threshold voltage.

$V_{SO2}$ indicates a voltage level of the second sensing node SO when the second sensing node SO is discharged.

$V_{trip}$ indicates a level of a reference voltage which is used to determine a memory cell as an on-cell. When a threshold voltage level of the memory cell is lower than the reference voltage, the memory cell may be determined as an on-cell. When the memory cell is sensed in a state where the voltage level of the second sensing node SO does not reach $V_{trip}$, although the memory cell is actually the on-cell, the memory cell may be erroneously determined as the off-cell. Accordingly, to correctly determine whether the memory cell is the on-cell or the off-cell, the voltage of the second sensing node SO may be sensed after a time required for the voltage level of the second sensing node SO to reach $V_{trip}$ elapses.

A time period $t_{eval}$ indicates a period of time required for the voltage level of the second sensing node SO to reach $V_{trip}$ when the second sensing node SO is not discharged.

A time period $t_{eval'}$ indicates a period of time required for the voltage level of the second sensing node SO to reach $V_{trip}$ when the second sensing node SO is discharged according to an embodiment of the present disclosure.

Referring to FIGS. 3A, 5, and 7, the second sensing node SO may be precharged to the power voltage $V_{CORE}$ in the bit line precharge period BL precharge. When the ninth transistor T9 is turned on by the control signal SA_SENSE in the evaluation period Evaluation, the second sensing node SO may be coupled to the first sensing node CSO. When a memory cell coupled to the bit line BL is an on-cell, it may take the time period $t_{eval}$ for the voltage level of the second sensing node SO to reach $V_{trip}$.

Referring to FIGS. 3B, 5, and 7, the second sensing node SO may be precharged to $V_{SO1}$ in the bit line precharge period BL precharge. After the second sensing node SO is precharged to $V_{SO1}$, the fifth transistor T5 may be turned on by the second discharge signal DSCH_2 of a negative voltage, thereby discharging the voltage of the second sensing node SO. The voltage of the second sensing node SO may be dropped to $V_{SO2}$ which is lower than $V_{SO1}$. When a memory cell coupled to the bit line BL is an on-cell, it may take the time period $t_{eval'}$ for the voltage level of the second sensing node SO to reach $V_{trip}$. Because $V_{SO2}$ is lower than $V_{SO1}$, the time period $t_{eval'}$ may be shorter than the time period $t_{eval}$.

As it has been described above in the embodiment of the present disclosure, the voltage level of the second sensing node SO may be discharged to a predetermined voltage level by a P-MOS transistor coupled to the second sensing node SO during an evaluation operation, thereby adjusting a time required for the voltage level of the second sensing node SO to reach $V_{trip}$.

A time required to perform a read operation may be reduced by reducing a time required for the voltage level of the second sensing node SO to reach $V_{trip}$.

The features described above with reference to FIGS. 6 and 7 may also be applied to a program verify operation of a memory cell in the same manner. When the features are applied to the program verify operation, an entire time required to perform a program operation tPROG may be reduced by reducing a time required to perform the program verify operation.

Figure 8:
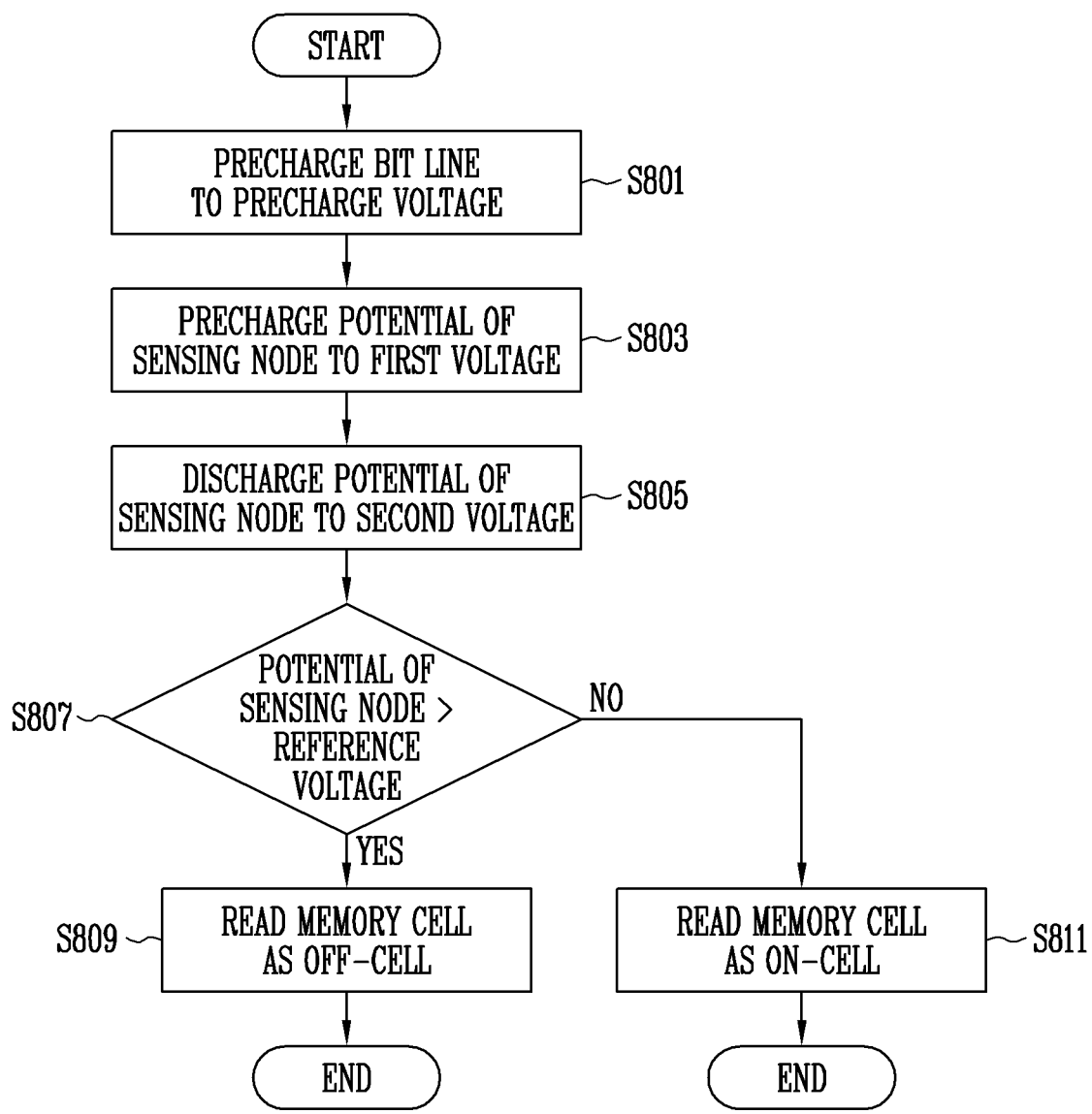
FIG. 8 is a flowchart illustrating a read operation of a memory cell according to an embodiment of the present disclosure.

FIG. 8 is a flowchart illustrating a method of operating a memory device according to an embodiment of the present disclosure.

At operation S801, the memory device may discharge a bit line to a precharge voltage.

At operation S803, the memory device may precharge a potential ($V_{SO}$) of a second sensing node to a first voltage.

At operation S805, the memory device may discharge the potential ($V_{SO}$) of the second sensing node to a second voltage.

At operation S807, the memory device may compare the potential ($V_{SO}$) of the second sensing node with a reference voltage ($V_{trip}$).

The memory device may store data in a latch circuit based on a result of comparing the potential ($V_{SO}$) of the second sensing node SO with the reference voltage ($V_{trip}$).

More specifically, at operation S809, the memory device may store a result of reading a memory cell as an off-cell in the latch circuit when the potential ($V_{SO}$) of the second sensing node SO is greater than the reference voltage ($V_{trip}$).

At operation S811, the memory device may store a result of reading the memory cell as an on-cell in the latch circuit when the potential ($V_{SO}$) of the second sensing node SO is less than or equal to the reference voltage ($V_{trip}$).

According to embodiments of the present disclosure, a page buffer in which overshoot of a bit line voltage is mitigated and an evaluation time is reduced during a read operation or a verify operation and a memory device including the page buffer may be provided.

The present disclosure described above is not limited by the aforementioned embodiments and the accompanying drawings. It is evident to a person having ordinary knowledge in the art to which the present disclosure pertains that the present disclosure may be substituted, modified, and changed in various ways without departing from the technical spirit of the present disclosure and the following claims. Furthermore, the embodiments may be combined to form additional embodiments.

What is claimed is:

1. A page buffer, comprising:
   a sensing node configured to sense a potential of a bit line coupled to a memory cell;
   a precharging circuit coupled to the sensing node and configured to precharge a potential of the sensing node to a first voltage during an evaluation operation on the memory cell;
   a discharging circuit coupled to the sensing node and configured to discharge the potential of the sensing node from the first voltage to a second voltage; and
   a latch circuit coupled to the discharging circuit and configured to store therein data sensed from the memory cell based on a result of comparing the potential of the sensing node with a reference voltage after the potential of the sensing node is discharged to the second voltage and a predetermined period elapses,
   wherein the evaluation operation is an operation of sensing a threshold voltage of the memory cell through the comparing the potential of the sensing node with the reference voltage,
   wherein the precharging circuit includes a first transistor and a second transistor coupled in series between a power voltage node and the sensing node,
   wherein the discharging circuit includes a third transistor, a fourth transistor, and a fifth transistor coupled between the sensing node and a ground node,
   wherein the fourth transistor and the fifth transistor are coupled in parallel, and wherein the third transistor is coupled in series to the parallel coupling of the fourth transistor and the fifth transistor, wherein the first transistor and the second transistor are turned on in a first period and are turned off in a second period, wherein the third transistor and the fifth transistor are turned on in the second period, wherein the fourth transistor is turned off in the second period.

2. The page buffer of claim 1, wherein the potential of the sensing node is precharged to the first voltage in the first period and is discharged to the second voltage in the second period.

3. The page buffer of claim 2, wherein the fifth transistor is a P-MOS device and the fourth transistor is an N-MOS device.

4. The page buffer of claim 1,
wherein the first transistor is controlled by a data value stored in the latch circuit,
wherein the second transistor is controlled by a first precharge signal,
wherein the third transistor is controlled by the data value stored in the latch circuit,
wherein the fourth transistor is controlled by a first discharge signal, and
wherein the fifth transistor is controlled by a second discharge signal.

5. The page buffer of claim 1, wherein the reference voltage is a voltage for determining whether the memory cell is an on-cell or an off-cell.

6. The page buffer of claim 1, wherein the latch circuit stores the data by reading the memory cell as an off-cell when the potential of the sensing node is higher than the reference voltage and as an on-cell when the potential of the sensing node is lower than the reference voltage.

7. A memory device, comprising:
a plurality of memory cells;
a peripheral circuit including a plurality of page buffers coupled to the plurality of memory cells through bit lines and configured to perform a read operation on selected memory cells among the plurality of memory cells; and
a control logic configured to control the peripheral circuit to sense data stored in the selected memory cells during the read operation,
wherein each of the plurality of page buffers comprises:
a first switch coupled between a bit line coupled to a memory cell and a first sensing node;
a second switch coupled between the first sensing node and a second sensing node;
a precharging circuit coupled to the first sensing node and the second sensing node, and configured to precharge the bit line to a precharge voltage during a bit line precharge operation of the read operation and configured to precharge the second sensing node to a first voltage during an evaluation operation of the read operation;
a discharging circuit coupled to the second sensing node and configured to discharge a potential of the second sensing node from the first voltage to a second voltage during the evaluation operation;
a latch circuit coupled to the discharging circuit and the second sensing node and configured to store therein the data of the selected memory cells based on a result of comparing the potential of the second sensing node with a reference voltage after the potential of the second sensing node is discharged to the second voltage and a predetermined period elapses, wherein the precharge circuit precharges the first sensing node in the bit line precharge operation, wherein the first switch is turned on after the first sensing node is precharged, and couples the bit line to the first sensing node, and wherein the second switch is turned on after the second sensing node is discharged to the second voltage and couples the first sensing node to the second sensing node.

8. The memory device of claim 7,
wherein the precharging circuit includes a first transistor and a second transistor coupled in series between a power voltage node and the second sensing node,
wherein the discharging circuit includes a third transistor, a fourth transistor, and a fifth transistor coupled between the second sensing node and a ground node,
wherein the fourth transistor and the fifth transistor are coupled in parallel, and
wherein the third transistor is coupled in series to the parallel coupling of the fourth transistor and the fifth transistor.

9. The memory device of claim 8,
wherein the first transistor and the second transistor are turned on in a first period and are turned off in a second period,
wherein the third transistor and the fifth transistor are turned on in the second period,
wherein the fourth transistor is turned off in the second period, and
wherein the potential of the second sensing node is precharged to the first voltage in the first period and is discharged to the second voltage in the second period.

10. The memory device of claim 8, wherein the fourth transistor is an N-MOS device and wherein the fifth transistor is a P-MOS device.

11. The memory device of claim 7, wherein the reference voltage is a voltage for reading whether the selected memory cells are on-cells or off-cells.

12. A method of operating a memory device, the method comprising:
precharging a bit line coupled to a memory cell to a precharge voltage;
precharging a potential of a sensing node coupled to the bit line to a first voltage;
discharging the potential of the sensing node from the first voltage to a second voltage; and
storing data of the memory cell in a latch circuit based on a result of comparing the potential of the sensing node with a reference voltage after the potential of the sensing node is discharged to the second voltage and a predetermined period elapses,
wherein the first voltage is a default voltage for precharging the sensing node to sense a threshold voltage of the memory cell, and
wherein the discharging of the potential of the sensing node includes discharging the default voltage to the second voltage by turning on a transistor coupled between the sensing node and a ground node.

13. The method of claim 12, wherein the transistor is a P-MOS device.

14. The method of claim 12, wherein the reference voltage is a voltage for determining whether the memory cell is an on-cell or an off-cell.

15. The method of claim 12, wherein the storing of the data of the memory cell in the latch circuit includes reading the memory cell as an off-cell when the potential of the sensing node is higher than the reference voltage and reading the memory cell as an on-cell when the potential of the sensing node is lower than the reference voltage.

* * * * *